(12) United States Patent
Blug et al.

(10) Patent No.: US 10,516,259 B2
(45) Date of Patent: Dec. 24, 2019

(54) TRANSIENT PROTECTION FOR MULTI-TERMINAL HVDC GRID

(71) Applicant: SIEMENS AKTIENGESELLSCHAFT, Munich (DE)

(72) Inventors: Christian Blug, Quierschied (DE); Guenter Ebner, Henfenfeld (DE); Li Shang-Jaeger, Erlangen (DE); Kai Trunk, Erlangen (DE); Klaus Wuerflinger, Nuremberg (DE); Marcus Zeller, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 252 days.

(21) Appl. No.: 15/321,828

(22) PCT Filed: Jun. 27, 2014

(86) PCT No.: PCT/EP2014/063724
§ 371 (c)(1),
(2) Date: Dec. 23, 2016

(87) PCT Pub. No.: WO2015/197137
PCT Pub. Date: Dec. 30, 2015

(65) Prior Publication Data
US 2017/0133834 A1    May 11, 2017

(51) Int. Cl.
*H02H 1/00* (2006.01)
*H02H 3/087* (2006.01)
(Continued)

(52) U.S. Cl.
CPC ......... *H02H 1/0007* (2013.01); *G01R 31/085* (2013.01); *H02H 3/087* (2013.01);
(Continued)

(58) Field of Classification Search
CPC .... H02H 1/0007; H02H 7/268; H02H 7/1257; H02H 3/087; H02H 7/1255; H02H 3/325;
(Continued)

(56) References Cited

U.S. PATENT DOCUMENTS 8,749,933 B2    6/2014   Berggren et al.

FOREIGN PATENT DOCUMENTS

| CN | 101882774 A | 11/2010 | |
| CN | 102856881 | * 1/2013 | ............. G01R 31/02 |

(Continued)

OTHER PUBLICATIONS

Zhao, Chengyong et al., "Control and Protection Strategies for MMC-HVDC under DC faults", Automation of Electric Power Systems, vol. 35, No. 23, Dec. 10, 2011 (Dec. 10, 2011) pp. 82-87—English abstract on p. 87.

*Primary Examiner* — Farhana A Hoque
(74) *Attorney, Agent, or Firm* — Laurence Greenberg; Werner Stemer; Ralph Locher

(57) ABSTRACT

A method and a device provide protection for a multi-terminal HVDC grid against faults. The method includes measuring a DC displacement voltage having a polarity and a value, determining if a short circuit fault exists by comparing the DC displacement voltage with a threshold displacement voltage and identifying a fault type based on the polarity and the value of the DC displacement voltage. The disclosed device contains a converter having a positive pole and a negative pole, a DC-switch substation, a DC line connecting the converter and the DC-switch substation and a transient fault detector. The transient fault detector contains a positive voltage sensor sensing a positive transient voltage of the positive pole and a negative voltage sensor sensing a negative transient voltage of the negative pole and (Continued)

a control unit which is adapted to derive a DC displacement voltage from the positive and the negative transient voltages.

11 Claims, 1 Drawing Sheet

(51) Int. Cl.
  *H02H 3/24* (2006.01)
  *H02H 3/32* (2006.01)
  *H02H 7/125* (2006.01)
  *H02H 7/26* (2006.01)
  *G01R 31/08* (2006.01)

(52) U.S. Cl.
  CPC ............ *H02H 3/243* (2013.01); *H02H 3/325* (2013.01); *H02H 7/1255* (2013.01); *H02H 7/1257* (2013.01); *H02H 7/26* (2013.01); *H02H 7/267* (2013.01); *H02H 7/268* (2013.01)

(58) Field of Classification Search
  CPC .......... H02H 3/243; H02H 7/267; H02H 7/26; G01R 31/085
  USPC ............................................ 296/70; 324/535
  See application file for complete search history.

(56) References Cited

FOREIGN PATENT DOCUMENTS

| | | | |
|---|---|---|---|
| CN | 102856881 A | | 1/2013 |
| CN | 1028566881 | * | 1/2013 |
| GB | 2449677 A | | 12/2008 |
| RU | 1777104 A1 | | 11/1992 |
| RU | 2300114 C1 | | 5/2007 |
| WO | 2011157305 A1 | | 12/2011 |
| WO | 2014071557 A1 | | 5/2014 |

* cited by examiner

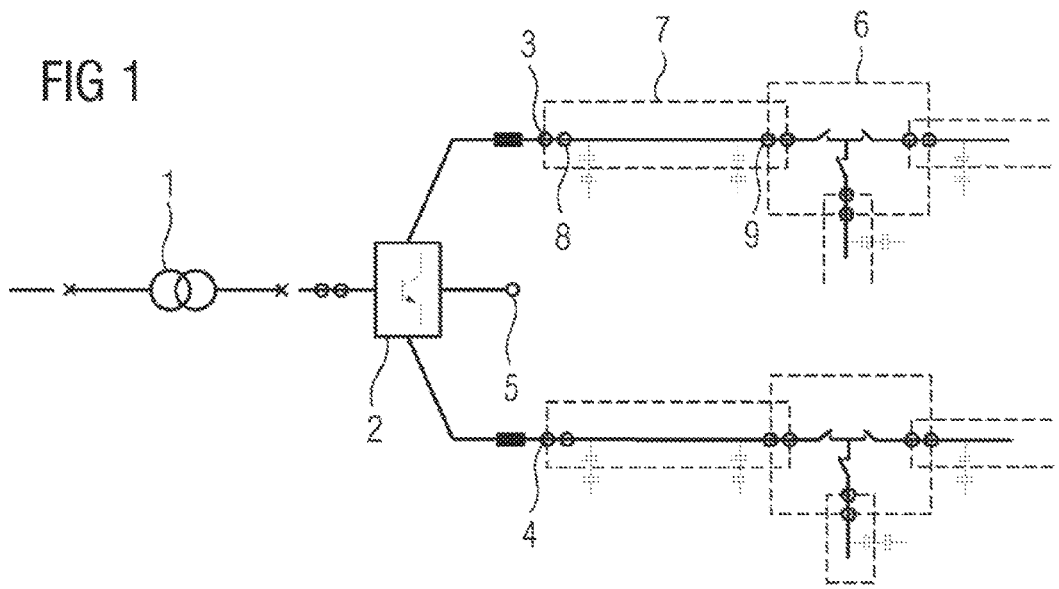
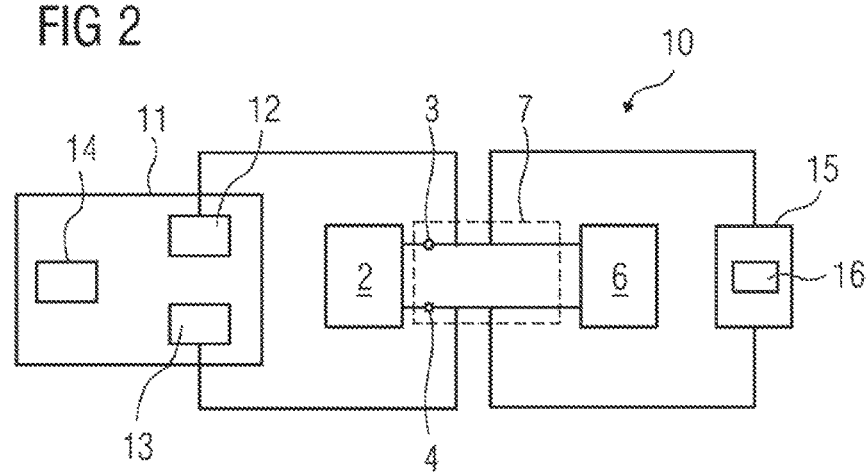
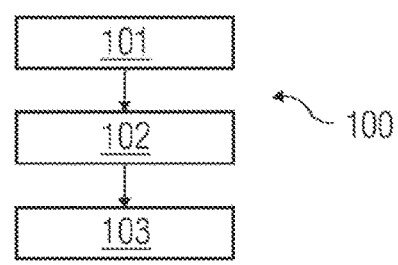

TRANSIENT PROTECTION FOR MULTI-TERMINAL HVDC GRID

BACKGROUND OF THE INVENTION

Field of the Invention

The present invention relates to a method and a device for providing transient protection for multi-terminal HVDC grid against faults.

HVDC transmission is being largely used for transmission of high power over long distances without any significant losses, making HVDC a preferred mode of power transmission over AC transmission for long distances, for example over 100 kms. In general applications, HVDC can carry more power per conductor than AC, because for a given power rating, the constant voltage in a DC line is lower than the peak voltage in an AC line. The current required to charge and discharge the capacitance of the cable causes additional power losses when the cable is carrying AC, while this has minimal effect for DC transmission. Use of HVDC grids also saves cost as only one or two conductors are required for HVDC transmission, whereas, three conductors are required for an AC transmission. Even insulation costs can be economized in HVDC transmission. Dielectric power loss in cables is less in DC than in AC. Hence, the current-carrying capacity of cables can be increased considerably. HVDC grids having more than two terminals are called as multi-terminal HVDC grids and are now being increasingly used. Multi-terminal HVDC grids can increase the reliability of power transmission by providing several alternative transmission paths instead of limiting itself to a single transmission path as in the case of two-terminal HVDC.

However, with the existing technology the whole of the HVDC grid is affected due to a short-circuit fault at any location in DC side. So far there is no existing method known for identifying the fault by its location and selectively choosing the DC lines which are not affected by the fault and continuing to operate them.

Therefore there is a crucial need for a protection system for multi-terminal HVDC grids for identification of short-circuit faults and for selective operation of multi-terminal HVDC grids during faults.

BRIEF SUMMARY OF THE INVENTION

It is an object of the present invention to provide a fast, reliable and a robust protection method for multi-terminal HVDC grid against faults which enables selective operation of grid thereby avoiding blackouts in case of faults.

The object of the invention is achieved by a method for providing protection for multi-terminal HVDC grid against faults and a device for protection of multi-terminal HVDC grid against faults. The HVDC grid comprises of a converter station, a DC-switch substation and a DC line connecting the converter station and the DC-switch substation. The converter station has a positive pole, a negative pole and a neutral pole. The positive pole is at the positive terminal of the converter, the negative pole is at the negative terminal of the converter and the neutral pole is either connected to the ground or is a floating neutral pole as the HVDC grid can be earthed or isolated.

The disclosed method comprises a step of measuring a DC displacement voltage Ud having a polarity and a value, a step of determining if there is a fault condition by comparing the DC displacement voltage Ud with a threshold displacement voltage Ut and a step of identifying a fault type based on the polarity and the value of the DC displacement voltage Ud.

The fault type can be segregated into three types of faults namely, a positive to neutral pole short circuit, a negative to neutral pole short circuit or a positive to negative pole short circuit.

According to a preferred embodiment of the invention, the DC displacement voltage Ud is calculated from a positive transient voltage Up measured at the positive pole and a negative transient voltage Un measured at the negative pole. The positive transient voltage Up and the negative transient voltage Un are DC transient voltages which are measured directly through voltage transformer terminals of the DC grid. The DC displacement voltage Ud is calculated as an average of the positive transient voltage Up and the negative transient voltage Un and can be represented by the below formula:

$$Ud=(Up+Un)/2$$

Advantageously the threshold voltage Ut is set at a value which is higher than maximum DC displacement voltage Ud in normal condition. For example, the threshold value Ut is set at a value which is 10% higher than the maximum DC displacement voltage Ud in normal condition. This would ensure a correct yet early detection of a fault without reacting to insignificant fluctuations in the voltage.

During a normal operating condition of the multi-terminal HVDC grid, the magnitude of the voltages measured at the positive and the negative poles are equal or in other words symmetrical. However when a fault occurs an imbalance in voltages can be experienced and the positive transient voltage Up differs from the negative transient voltage Un. The step of determining if the fault exists is carried out by assessing if the value of the DC displacement voltage Ud is greater than the threshold displacement voltage Ut.

According to a further embodiment of the invention, the step of identifying the fault type is executed by measuring the polarity and the value of the DC displacement voltage Ud. If the polarity of the DC displacement voltage Ud is negative the fault type is identified as the positive to neutral pole short circuit, if the polarity of the DC displacement voltage (Ud) is positive the fault type is identified as the negative to neutral pole short circuit and if the DC displacement voltage (Ud) has a greater value than the threshold displacement voltage (Ut) the fault type is identified as the positive to negative pole short circuit. By identifying the fault type the process for selective isolation of the faulty line can be triggered to provide the protection mechanism as disclosed in this invention. Moreover, according to an alternative variant of the invention the fault type identification is based only on polarity measurement of the DC displacement voltage Ud hence it places a less strict requirement on measuring accuracy.

In case the DC displacement voltage Ud has a lesser value than the threshold displacement voltage Ut then a no fault condition is detected. This means that the HVDC grid is working normally and without any short circuit faults. As long as the displacement voltage Ud has a value lesser than the threshold displacement voltage, it indicates that the system is operating normally without any short circuit faults.

In another embodiment of the invention, the method comprises a step of detecting a direction of a fault current. The direction of the fault current can be towards the converter or towards the DC line when measured at the converter. Similarly, the direction of the fault current can be towards the DC-switch substation or towards the DC line when measured at the DC-switch substation. The direction of the fault current is detected based on a polarity of a DC transient current change ΔId measured at the converter terminal and a polarity of a DC transient current change ΔId measured at the DC-switch substation terminal for each of the aforementioned instances. The method provides for a high speed direction detection of any short circuit fault current through the whole HVDC grid based on evaluation of a DC transient current. Also, since the fault direction detection is based only on polarity measurement of the DC transient current change ΔId there is no strict requirement of having great accuracy in measuring the DC transient current change ΔId values.

The DC transient current change ΔId is calculated as a difference between a DC transient current Id and a rated DC current Idc and can be represented by the below formula:

$$\Delta Id = Id - Idc$$

The DC transient current Id is the fault current that flows through the grid during a fault condition such as a short circuit. It can be measured directly through current transformer of the HVDC grid. The rated DC current Idc is the current that flows through the grid during a normal operating condition or a no fault condition of the multi-terminal HVDC grid, i.e. before the occurrence of a fault.

According to an embodiment of the invention the step of detecting the direction of the fault current is executed by sensing the polarity of the DC transient current change ΔId such that when the polarity of the DC transient current change ΔId at the converter terminal is negative then the direction of the fault current is towards the DC line; when the polarity of the DC transient current change ΔId at the converter terminal is positive then the direction of the fault current is towards the converter; when the polarity of the DC transient current change ΔId at the DC-switch substation terminal is positive then the direction of the fault current is towards the DC line and when the polarity of the DC transient current change ΔId at the DC-switch substation terminal is negative then the direction of the fault current is towards the DC-switch substation. Detection of the direction of the fault current can be used for differential protection of the different terminals of the multi-terminal HVDC grid by selective blocking or permitting of fault current path.

In another embodiment an additional pre-criteria is set for triggering detection of direction of the fault current. A threshold transient current change ΔIt value is set which is higher than the maximum current transformer measure error in normal operating condition. For example, the threshold transient current change ΔIt value can be set at a value which is 10% higher than the current transformer rated current. When the DC transient current change ΔId has a value greater than the threshold transient current change value ΔIt, then the step of detecting the direction of the fault current is triggered. This will ensure that the method is resistant to measurement errors and is robust.

In yet another embodiment the method further comprises a step of detecting if the fault is internal or external in respect of each converter station, i.e. if the fault is internal to the converter station or external to it. This detection is done by comparing the polarities of the DC transient current change ΔId between the converter terminal and the DC-switch substation terminal. This step provides for setting up of transient line differential protection and helps to identify and isolate the converter station on which the fault has occurred.

In one embodiment, the step of detecting if the fault is internal or external in respect of the converter station is carried out such that when the polarity of the DC transient current change ΔId at the converter terminal and the polarity of the DC transient current change ΔId at the DC-switch substation terminal are different then the fault is internal.

During the internal fault, i.e. when the fault is at a particular converter station, the direction of the fault current at the converter terminal as well as at the DC-switch substation terminal is both towards the DC line. And an external fault is detected in respect of a particular converter station when the polarity of the DC transient current change ΔId at the converter terminal and the polarity of the DC transient current change ΔId at the DC-switch substation terminal are same. During an external fault, i.e. when the fault is not at the particular converter station but at any other converter station, the direction of the fault current at the converter terminal is towards the DC line and the direction of the fault current at the DC-switch substation terminal is towards the DC-switch substation or the direction of the fault current at the converter terminal is towards the converter station and the direction of the fault current at the DC-switch substation terminal is towards the DC line.

In another embodiment of the invention the method further comprises a step of providing a transient busbar differential protection for multiple terminals of the DC-switch substation. When the polarity of the DC transient current change ΔId at all the multiple terminals of the DC-switch substation is negative then the fault is internal and when the polarity of the DC transient current ΔId change at all the multiple terminals of the DC-switch substation are different then the fault is external in respect of the particular DC-switch substation. The transient busbar differential protection works with polarity comparison among all terminals or feeders in a single DC-switch substation. This helps in identifying an external fault or an internal fault with respect to the multiple terminals of a DC-switch substation.

According to another embodiment of the invention the method comprises a step of detecting a transient fault location on the DC line based on a propagation time of travelling waves initiated by the fault. This step enables the method to locate the fault generating point on the affected DC line and isolate it so that the multi-terminal HVDC grid continues to operate with the remaining terminals. This feature helps in maintenance of the DC line.

A DC transient voltage or current is measured directly through the voltage or current transformers respectively of the HVDC grid. Then a module maxima is calculated which is a strict local absolute maxima value of coefficients of DC transient voltage or current. The DC line is having two terminals, the converter terminal connected to the converter and the DC-switch substation terminal connected to the DC-switch substation. The step of detection of transient fault location is carried out based on a voltage or a current surge arrival time at the two terminals. An exemplary fault detection algorithm for detecting a transient fault location from a first terminal, say the converter terminal, can be represented as:

$$L1F = (L - v^*(t2-t1))/2$$

In the above formula, L1F is the distance of the transient fault location from the first terminal, i.e. the converter terminal in this example; v is the speed of the travelling waves initiated by the fault; t1 is time of voltage or current of modules maxima at the first terminal, i.e. the converter terminal, and t2 is time of voltage or current of modules maxima at a second terminal, i.e. the DC-switch substation terminal in this example.

For transient fault location both DC transient voltages Up, Un and current Id can be used for HVDC grids having cable lines and overhead lines. However, for HVDC grids having mixed lines, only transient current Id can be used.

In one embodiment of the present invention a device for protection of multi-terminal HVDC grid against faults is disclosed. The device comprises of a converter station having a positive pole and a negative pole, a DC-switch substation, a DC line connecting the converter station and the DC-switch substation and a transient fault detector. The transient fault detector comprises of a positive voltage sensor sensing a positive transient voltage Up at the positive pole and a negative voltage sensor sensing a negative transient voltage Un at the negative pole and a control unit which is adapted to derive a DC displacement voltage Ud from the positive Up and the negative Un transient voltages. The DC displacement voltage has a polarity and a value. The transient fault detector detects the type of short-circuit faults in the HVDC grid. This helps in identifying the nature of the fault in the multi-terminal grids as a fault on the positive pole, the negative pole or between the positive and the negative pole.

In yet another embodiment the device further comprises a transient fault direction detector for detecting a direction of a fault current passing through the multi-terminal HVDC grid. The transient fault direction detector comprises of a current sensor for measuring DC transient current Id directly from the current transformer.

The above-mentioned and other features of the invention will now be addressed with reference to the accompanying drawings of the present invention. The illustrated embodiments are intended to illustrate, but not limit the invention. The drawings contain the following figures, in which like numbers refer to like parts, throughout the description and drawing.

BRIEF DESCRIPTION OF THE SEVERAL VIEWS OF THE DRAWING

FIG. 1 is a schematic diagram showing a device for providing transient protection for multi-terminal HVDC grid against faults.

FIG. 2 displays a block diagram of the device as disclosed in the invention.

FIG. 3 shows a flowchart containing the steps according to the disclosed method.

DESCRIPTION OF THE INVENTION

As seen in FIG. 1, the converter 2 comprises two poles, the positive 3 and the negative 4 poles. The converter 2 is connected to a DC-switch substation 6 through a DC line 7. The DC line 7 connects to the converter 2 through a converter terminal 8 and to the DC-switch substation 6 through a DC-switch substation terminal 9. The neutral pole 5 of the converter 2 can be either grounded or isolated and floating. A multi-terminal HVDC setup can comprise of several such converters 2.

During fault type identification, the three types of faults are identified as a positive 3 to neutral 5 pole short circuit, a negative 4 to neutral 5 pole short circuit or a positive 3 to negative 4 pole short circuit.

The fault current direction detection is carried out at the converter as well as at the DC-switch substation. The fault current direction is either towards the converter 2 or the DC line 7 when viewed from the converter terminal 8 of the converter 2 or is it either towards the DC-switch substation 6 or the DC line 7 when measured at a DC-switch substation terminal 9 of the DC-switch substation 6.

For external or internal fault detection, it is identified for every converter 2 if the fault lies in that particular converter 2 or any of the other converters in the multi-terminal HVDC grid 1.

FIG. 2 displays a block diagram of the device 10 as disclosed in the invention. The converter 2 is connected through the DC line 7 to the DC-switch substation 6. The device 10 comprises a transient fault detector 11. The transient fault detector 11 measures the transient voltages Up, Un at the positive 3 and the negative 4 poles by a positive voltage sensor 12 and a negative voltage sensor 13 respectively. The control unit 14 derives a DC displacement voltage Ud from the positive Up and the negative Un transient voltages. The device 10 further comprises a transient fault direction detector 15 comprising a current sensor 16 for detecting a direction of a fault current.

According to a further embodiment the device 10 comprises a transient fault locator (not shown in FIG. 2) for detecting a location of the fault on the DC line 7. The transient fault locator comprises of a voltage sensor for measuring the positive Up or negative Un transient voltages or a current sensor for measuring the DC transient current Id.

FIG. 3 displays the steps to be carried out for providing transient protection to multi-terminal HVDC grids 1 against short circuit faults. The method 100 comprises a first step 101 of measuring a DC displacement voltage Ud having a polarity and a value. Thereafter a step 102 of determining if the fault exists is carried out. Finally a step 103 of identifying a fault type is executed.

The disclosed method 100 protects the HVDC grid 1 against short circuit faults by identifying the fault type, the faulty converter and additionally identifying the location where the fault was generated from.

The method 100 provides for measurement of a DC displacement voltage Ud having a polarity and a value. When a short circuit fault event occurs, the disclosed method 100 recognizes the occurrence of a fault by comparing the DC displacement voltage Ud with a threshold displacement voltage Ut. When the DC displacement voltage Ud exceeds the threshold displacement voltage Ut a short circuit condition is identified. The next step is identification of a fault type as a positive 3 to neutral 5 pole short circuit, a negative 4 to neutral 5 pole short circuit or a positive 3 to negative 4 pole short circuit based on the polarity and the value of the DC displacement voltage Ud.

Additionally the method comprises a step of detecting a direction of a fault current as towards the converter 2 or the DC line 7 when measured at a converter terminal 8 of the converter 2 or towards the DC-switch substation 6 or the DC line 7 when measured at a DC-switch substation terminal 9 of the DC-switch substation 6. The direction of the fault current is detected based on a polarity of a DC transient current change ΔId measured at the converter terminal 8 and a polarity of a DC transient current change ΔId measured at the DC-switch substation terminal 9.

Further the method 100 comprises a step of detecting if the fault is internal or external in respect of the converter 2 by comparing the polarities of the DC transient current change ΔId between the converter terminal 8 and the DC-switch substation terminal 9.

In yet another embodiment of the method 100 a step of providing a transient busbar differential protection for multiple terminals of the DC-switch substation 6 is envisaged. In this step when the polarity of the DC transient current change ΔId at all the multiple terminals of the DC-switch substation 6 is negative then the fault is internal and when the polarity of the DC transient current change ΔId at all the multiple terminals of the DC-switch substation 6 are different then the fault is external, in respect of the DC-switch substation 6.

In a further embodiment the method 100 comprises a step of detecting a transient fault location on the DC line 7 based on a propagation time of travelling waves initiated by the fault.

Although the invention has been described with reference to specific embodiments, this description is not meant to be construed in a limiting sense. Various modifications of the disclosed embodiments, as well as alternate embodiments of the invention, will become apparent to persons skilled in the art upon reference to the description of the invention. It is therefore contemplated that such modifications can be made without departing from the embodiments of the present invention as defined.

LIST OF REFERENCE NUMBERS

1 multi-terminal HVDC grid
2 converter station
3 positive pole
4 negative pole
5 neutral pole
6 DC-switch substation
7 DC line
8 converter terminal
9 DC-switch substation terminal
10 device
11 transient fault detector
12 positive voltage sensor
13 negative voltage sensor
14 control unit
15 transient fault direction detector
16 current sensor
17 transformer
100 method
101 a step of measuring a displacement voltage
102 a step of determining if the fault exists
103 a step of identifying a fault type

The invention claimed is:

1. A method for protecting a multi-terminal HVDC grid against faults, the HVDC grid containing a converter having a positive pole, a negative pole and a neutral pole, a DC-switch substation and a DC line connecting the converter and the DC-switch substation, which method comprises the steps of:
   measuring a DC displacement voltage having a polarity and a value;
   determining if a fault exists by comparing the DC displacement voltage with a threshold displacement voltage; and
   identifying a fault type as a positive to neutral pole short circuit, a negative to neutral pole short circuit or a positive to negative pole short circuit based on the polarity and the value of the DC displacement voltage;
   wherein the step of identifying the fault type is executed by measuring the polarity and the value of the DC displacement voltage such that if the polarity of the DC displacement voltage is negative the fault type is identified as the positive to neutral pole short circuit, if the polarity of the DC displacement voltage is positive the fault type is identified as the negative to neutral pole short circuit and if the DC displacement voltage has a greater value than the threshold displacement voltage the fault type is identified as the positive to negative pole short circuit.

2. The method according to claim 1, which further comprises calculating the DC displacement voltage from a positive transient voltage measured at the positive pole and a negative transient voltage measured at the negative pole.

3. The method according to claim 1, wherein the step of determining if the fault exists is carried out by assessing if the value of the DC displacement voltage is greater than the threshold displacement voltage.

4. The method according to claim 1, which further comprises detecting a no fault condition when the value of the DC displacement voltage is lesser than the threshold displacement voltage.

5. The method according to claim 1, which further comprises detecting a direction of a fault current as towards the converter or the DC line when measured at a converter terminal of the converter based on a polarity of a DC transient current change measured at the converter terminal or, towards the DC-switch substation or the DC line when measured at a DC-switch substation terminal of the DC-switch substation based on the polarity of the DC transient current change measured at the DC-switch substation terminal.

6. The method according to claim 5, which further comprises calculating the DC transient current change as a difference between a DC transient current and a rated DC current.

7. The method according to claim 5, wherein the step of detecting the direction of the fault current is executed by sensing the polarity of the DC transient current change such that when the polarity of the DC transient current change at the converter terminal is negative then the direction of the fault current at the converter terminal is towards the DC line, when the polarity of the DC transient current change at the converter terminal is positive then the direction of the fault current is towards the converter, when the polarity of the DC transient current change at the DC-switch substation terminal is positive then the direction of the fault current at the DC-switch substation terminal is towards the DC line and when the polarity of the DC transient current change at the DC-switch substation terminal is negative then the direction of the fault current is towards the DC-switch substation.

8. The method according to claim 5, which further comprises detecting if the fault is internal or external in respect of the converter by comparing the polarities of the DC transient current change between the converter terminal and the DC-switch substation terminal.

9. The method according to claim 8, wherein the step of detecting if the fault is internal or external in respect of the converter is carried out such that when the polarity of the DC transient current change at the converter terminal and the polarity of the DC transient current change at the DC-switch substation terminal are different then the fault is internal and when the polarity of the DC transient current change at the converter terminal and the polarity of the DC transient current change at the DC-switch substation terminal are same then the fault is external in respect of the converter.

10. The method according to claim 5, which further comprises providing a transient busbar differential protection for multiple terminals of the DC-switch substation, wherein when the polarity of the DC transient current change at all the multiple terminals of the DC-switch substation is negative then the fault is internal and when the polarity of the DC transient current change at all the multiple terminals of the DC-switch substation are different then the fault is external, in respect of the DC-switch substation.

11. The method according to claim 1, which further comprises detecting a transient fault location on the DC line based on a propagation time of travelling waves initiated by the fault.

* * * * *